(12) United States Patent
Ter Meulen et al.

(10) Patent No.: US 11,402,748 B2
(45) Date of Patent: Aug. 2, 2022

(54) METHOD FOR TEXTURING DISCRETE SUBSTRATES

(71) Applicant: Morphotonics Holding B.V., Veldhoven (NL)

(72) Inventors: Jan Matthijs Ter Meulen, Eindhoven (NL); Bram Johannes Titulaer, Veldhoven (NL); Adrianus Johannes Van Erven, Casteren (NL)

(73) Assignee: Morphotonics Holding B.V., Veldhoven (NL)

( * ) Notice: Subject to any disclaimer, the term of this patent is extended or adjusted under 35 U.S.C. 154(b) by 208 days.

(21) Appl. No.: 15/549,502

(22) PCT Filed: Feb. 11, 2016

(86) PCT No.: PCT/EP2016/052873
§ 371 (c)(1),
(2) Date: Aug. 8, 2017

(87) PCT Pub. No.: WO2016/128494
PCT Pub. Date: Aug. 18, 2016

(65) Prior Publication Data
US 2018/0031966 A1 Feb. 1, 2018

(30) Foreign Application Priority Data
Feb. 13, 2015 (EP) .................................. 15155038

(51) Int. Cl.
*G03F 7/00* (2006.01)
*B41F 7/02* (2006.01)
(52) U.S. Cl.
CPC .............. *G03F 7/0002* (2013.01); *B41F 7/02* (2013.01)

(58) Field of Classification Search
CPC ..................................................... G03F 7/0002
See application file for complete search history.

(56) References Cited

U.S. PATENT DOCUMENTS

| 2006/0032437 A1* | 2/2006 | McMackin | G03F 7/0002 |
| | | | 118/100 |
| 2012/0183690 A1* | 7/2012 | Titulaer | B82Y 10/00 |
| | | | 427/256 |
| 2012/0200005 A1* | 8/2012 | Sato | B82Y 10/00 |
| | | | 264/293 |

FOREIGN PATENT DOCUMENTS

| EP | 2476538 A2 | 7/2012 |
| KR | 2012 0048393 A | 5/2012 |

* cited by examiner

*Primary Examiner* — Austin Murata
(74) *Attorney, Agent, or Firm* — Hammer & Associates, P.C.

(57) ABSTRACT

A roll-to-plate process for texturing or patterning discrete substrates, such as displays, lighting or solar panels comprising the steps of supplying an imprinting lacquer, texturing or patterning the imprinting lacquer with an imprint texture which imprint texture is formed by openings and elevations thus creating volumes in the imprint texture to obtain an imprinted lacquer and optionally followed by curing the imprinted lacquer to obtain a solidified textured or patterned layer, characterized in that the texturing or patterning is performed with an imprint texture that comprises domains of greater volumes at its edges, and with a flexible stamp with a Young's Modulus of between 0.1 Giga Pascal (GPa) and 10 Giga Pascal (GPa).

5 Claims, 6 Drawing Sheets

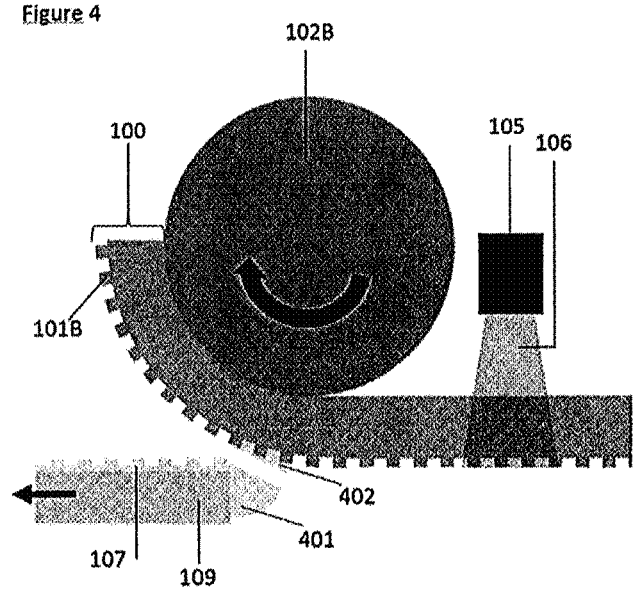

Figure 1:
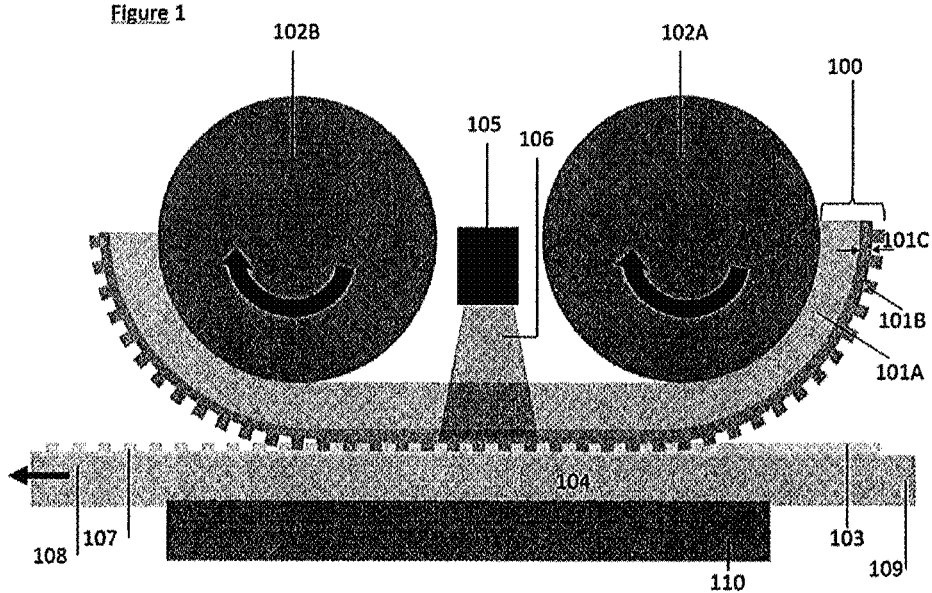

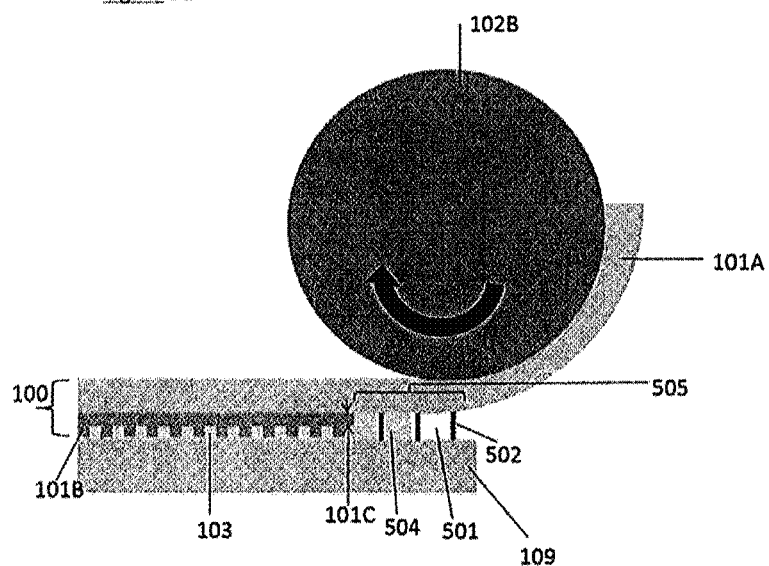
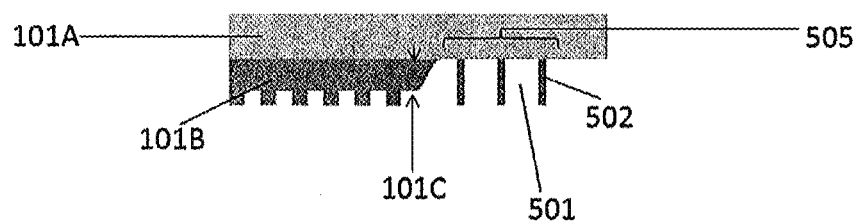
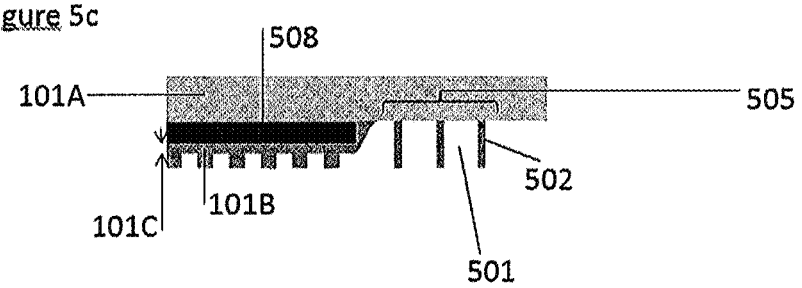

Left side schematic plate-to-plate process and right side schematic roll-to-plate process illustrated from aside of the roller.

Left side schematic plate-to-plate process and right side schematic roll-to-plate process illustrated from in front of the roller.

METHOD FOR TEXTURING DISCRETE SUBSTRATES

The invention pertains to a process for texturing or patterning discrete substrates or panels, such as displays, lighting or solar panels, by imprinting a lacquer with an imprint texture, followed by curing of the imprinted lacquer, resulting in an additional functional textured layer on the discrete substrate or panel. The function can amongst others vary from a light management layer to a hydrophobic layer, decorative use or use in biosensors. The invention further pertains to a stamp that imprints the lacquer to texture or pattern the discrete substrates or panels and to a textured substrate or panel.

The use of functional textured layers on devices is an important topic. The smart usage of such layers can enhance performance, reduce cost or improve the visual appearance of the product. For example diffusing layers are used in displays, enabling the use of thinner LED backlight concepts and illuminating the display from the sides. Other new high tech possibilities are the integration of functional textured layers into solar panels improving their efficiency or integration in organic light-emitting diode (OLED) lighting panels to extract more light.

Functional textured layers can be made by use of imprint lithography. In this case the substrate, or mold, or both sides are coated with a lacquer (resin or resist). After pressing the mold on the substrate with lacquer in between, the textured lacquer is cured to a solid phase. The curing method can be thermal or by use of UV light. Already in 1978 this technology was mentioned in U.S. Pat. No. 4,128,369. Further pioneer work was done by Chou in 1995. He demonstrated that by use of a rigid stamp sub-25 nm textures could be replicated in high throughput mass production (U.S. Pat. No. 5,772,905) or in an article by Stephen Y. Chou, Peter R. Krauss, Preston J. Renstrom (Appl. Phys. Lett. 67 (1995) 3114-3116). Later-on the use of a roller to apply pressure on either a rigid mold or a bended thin metal sheet to replicate textures was demonstrated (article Hua Tan, Andrew Gilbertson, Stephen Y. Chou, J. Vac. Sci. Technol., B 16 (1998) 3926-3928).

Many institutes and companies continued this work, resulting in different techniques. In the semiconductor industry plate-to-plate imprinting is applied by using a rigid stamp in combination with a transfer process, materials and precise positioning as described in U.S. Pat. No. 6,334,960, US Patent Application 2004/0065976 and U.S. Pat. No. 8,432,548. US 2006/0177532 A1 describes a plate-to-plate imprinting method to control a quantity of liquid from extruding from a volumetric gap defined between a mold included in the substrate and a region of the substrate in superimposition therewith that features varying the capillary forces between the liquid and one of the template and the substrate. To that end, the method includes generating capillary forces between the liquid and one of the template and the substrate, and varying a magnitude of the forces to create a gradient of forces.

US 2006/0266244 A1 describes a plate-to-plate imprinting apparatus that has a substrate table configured to hold a substrate, a template holder configured to hold an imprint template, the imprint template or the template holder having a template alignment mark configured to be imprinted onto the substrate table or onto a substrate to form an imprinted alignment mark, the imprint template having a functional pattern having a known spatial relationship, and an alignment sensor configured to determine the location of the imprinted alignment mark.

US 2011/0097827 A1 describes a pattern formation method in a plate-to-plate imprint process. The method places a liquid resin material on a workpiece substrate, presses a template against the resin material and measures the distance between a lower surface of a projection of a template and an upper surface of the workpiece substrate. The template includes a pattern formation region and a circumferential region around the pattern formation region. A pattern for circuit pattern formation is formed in the pattern formation region and the projection is formed in the circumferential region. The method forms a resin pattern by curing the resin material in a state of pressing the template, and can separate the template from the resin pattern.

WO 2014/175134 A1 describes an imprint mold for plate-to-plate imprinting. The imprint mold has, in a pattern region on the main surface of a base, a main pattern comprising a recessed and projected structure and a dummy pattern comprising a recessed and a projected structure for assisting transfer of the main pattern.

At least one end portion of the recessed structure or the projected structure of the dummy pattern reaches the outermost periphery of the pattern region, and no closed region that is surrounded by the recessed structure or the projected structure of one or more dummy patterns is within the pattern region when the imprint mold is viewed in plan.

A different technology is the roll-to-plate imprinting process. This roll-to-roll imprinting technique uses textured rollers in combination with flexible substrates to texture foils or films in a continuous process as described in e.g. the U.S. Pat. No. 8,027,086.

The first mentioned plate-to-plate technique is designed for the precise, wafer-scale, imprinting of small textures (resolution in sub-100 nm) on uniform flat wafers with a high position accuracy. But as described in the Chinese Patent Application CN 103235483, this technology is difficult to scale to lager areas.

By use of the roll-to-roll technology textured foils can be made continuously at high production speeds. These foils can be used as substrates for flexible applications or can be laminated to rigid substrates. However the latter comes at additional costs of an intermediate adhesive layer to adhere the textured foil to the rigid substrate or product. Therefore a third new technology is being developed: direct roll-to-plate imprinting. Hereby the functional textured layer is directly applied on the discrete substrate panel without intermediate thick adhesive layers of tens to hundreds of micron thickness. In such processes either a textured roller, as exemplified in the French Patent 2,893,610 or a removable flexible stamp is used, as disclosed in U.S. Pat. No. 7,824,516.

In contrast to the continuous roll-to-roll process, the challenges of the discontinuous roll-to-plate process are start-stop effects. An additional challenge compared to the roll-to-roll process as well as the plate-to-plate process is the fact that the textured surface is typically not cut back into smaller samples in the roll-to-plate process. Therefore the full sample, including the edges of the samples, has to be made well controlled in the roll-to-plate process without such post-processing.

As already mentioned in the introductory paragraph the imprinting is achieved by coating either a lacquer onto a substrate (panel) or on the mold and imprinting (texturing) it by contacting the mold and the substrate with lacquer in between. As mold either a flexible stamp, rigid stamp or a textured roller can be used. Coating can be done in various ways, such as—but not limited to—dispensing, ink-jet printing, screen printing, jetting, spraying, slot-die coating or roll-coating the lacquer onto the substrate or stamp.

In the course of the invention with the term "lacquer" a substance is meant that can be coated onto a substrate and textured (imprinted) by methods known to those skilled in the art. The lacquer usually comprises monomers, oligomers, with possibly added photo-initiators and crosslinking acrylate groups. Other possible materials are—but not limited to—curable sol-gels and epoxies. The lacquer is capable of being cured to retain the imprinted pattern. These curing processes are also known and encompass thermal curing, curing by UV light, chemically induced curing and other methods known per se. Such lacquers are also referred to as coatings, resins, resists and the like.

Also, in the course of this invention the items that are being imprinted with the lacquer are referred to as substrates or panels. These substrates or panels can be glass, plastic or metal substrates, sub-assemblies, or can be finished devices as displays, lighting or solar panels.

The problem attributed to this imprinting technology is that due to the movement of the flex stamp or the roller relatively to the substrate, surplus lacquer could be forwarded opposite to the imprint direction or pressed aside or even backwards. How much of the surplus lacquer is being forwarded and eventually could overflow the designated imprinting area depends among others on several characteristics:
  Substrate-to-substrate surface height variation, caused e.g. by irregularities in the substrate or thickness variations
  Resin layer thickness variation, by either variation in the coating process or rheological property variation of the lacquer itself
  Defects and/or height variations in the flexible stamp or mold
  Pressure (imprinting force) of the roller With near zero pressure (force) the surplus of lacquer will not be pushed forward, however the texture replication will not be sufficient either, since the textures will not be filled completely by the lacquer. If not enough lacquer is used this only gives partial imprinting at the end, i.e. either the texture will not be fully replicated, or parts of the substrate will not have a texture at all. When a surplus of lacquer is used this can cause an overflow of lacquer at the beginning, the sides and at the end of the imprint area. Therefore the sides of the panels might lose functionality and will look visually less appealing. Furthermore, the overflow area will require additional space on the substrate. For most applications a visual straight edge is required, with a minimal overflow area.

The prior art seeks to solve the overflow problem e.g. by selection of the largest planar area and aligning the features accordingly to this area as proposed in U.S. Pat. Nos. 8,349,241 and 8,066,930 or by the application of an exact amount of lacquer such as proposed in US Patent Application 2005/270312. However, for the application of adding functional textured layers to sub-assemblies or finished panels, no selection of the imprint area is possible. Typically almost the complete area up to the edges should be covered. However, most large area substrates—and in contrast to e.g. wafers—do have large (often random) variations in their surface profile. Therefore a small lacquer surplus will always be required. This surplus will lead to irregular edges, instead of defined edges.

In the U.S. Pat. No. 7,802,978 local printing is proposed for yield optimization by printing full dies with imprinting lacquers and partial dies with non-reactive liquid as isopropanol. Furthermore, this prior art proposes optimization of pressure applied at the edges as well as elaborate film thickness measurements with a feedback loop to the adjustable coating method. Each of the proposed solutions makes the system expensive and slow. U.S. Pat. No. 8,361,371 discloses a wafer based process with very limited over spill and precise dosing. This document tries to solve the over spill problem by UV pre-curing during imprinting to solidify the edges.

Further and from FIG. 11 onwards the U.S. Pat. No. 8,361,371 uses capillary forces to slow down the propagation, which only works with small textures having a height of no more than 100 nm, and a width of no more than 2 µm.

Korean Patent Application KR 2012/048393 discusses texture height differences in the mold. This change is needed to prevent leakage of chemical liquid to the outside of an imprint surface, added later on a textured surface. The change is used as a blocking protrusion, which will block liquid leakage in the functionality of the textured surface in use.

The Taiwanese Patent Application TW 201036799 proposes a large trench to gather the surplus of lacquer. The flow and gathering of the surplus of lacquer in this trench will be uncontrolled and irregular. For semiconductor application this will not have an impact, since the wafer substrate will be cut into smaller pieces. The trench will not be present and therefore not visible on the end product. The present invention enables defined textured area edges and to improve the visual appearance of the end product with an imprinted textured surface.

The underlying task of the present invention is to achieve an imprinted textured surface without the disadvantages of the prior art.

This task is achieved by a roll-to-plate process for texturing or patterning discrete substrates, such as displays, lighting or solar panels, which process comprises the steps of supplying an imprinting lacquer, texturing or patterning the imprinting lacquer with an imprint pattern which imprint texture is formed by openings and elevations thus creating volumes in the imprint texture to obtain an imprinted lacquer and optionally followed by curing the imprinted lacquer to obtain a solidified textured or patterned layer, characterized in that the texturing or patterning is performed with an imprint texture that comprises domains of greater volumes at its edges, and with a flexible stamp with a Young's Modulus of between 0.1 Giga Pascal (GPa) and 10 Giga Pascal (GPa), preferably between 0.5 Giga Pascal (GPa) and 5 Giga Pascal (GPa). The Young's Modulus is measured according to ASTM E111.

The domains of greater volumes are also referred hereinforth as to reservoirs.

The present invention thus is directed to gather the overflow by use of controlled laminar flow of the imprinting lacquer in a roll-to-plate process, and use of domains of greater volume.

The invention is being explained now in more detail with reference to the following Figures:

FIG. 1 schematically depicts an imprinting process.

Figure 1B:
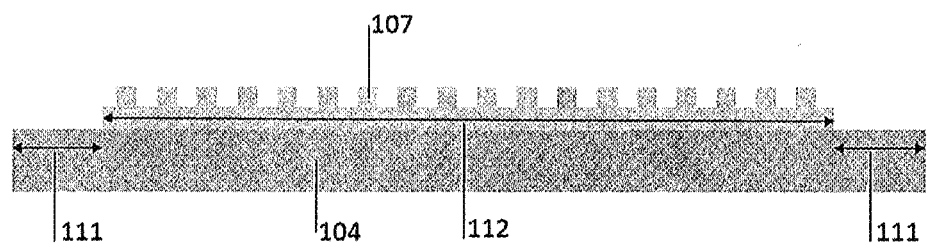

FIG. 1*b* schematically depicts a substrate with is partially covered by a solidified layer and having a textured surface.

Figure 2:
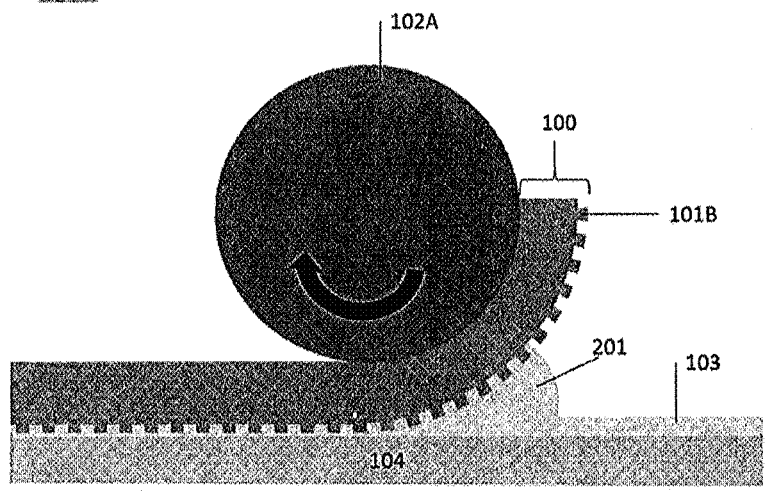

FIG. 2 schematically depicts the development of a surplus of the imprinting lacquer.

Figure 3:
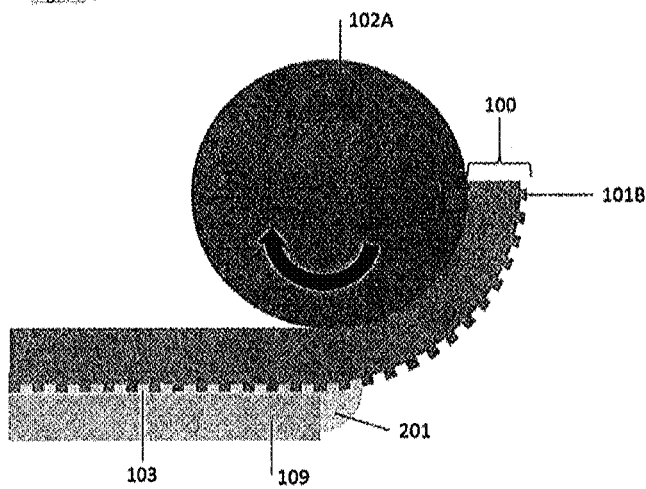

FIG. 3 schematically depicts the remaining of the overflow at the end of the substrate.

FIG. 4 schematically depicts the remaining of the overflow on the substrate and flexible stamp after release of the flexible stamp.

Figure 5:
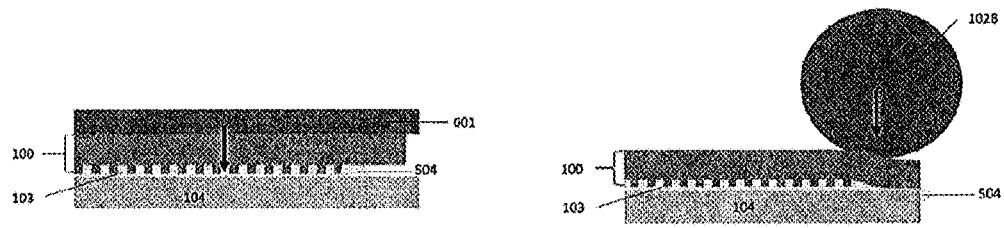

FIG. 5a, b, c schematically depict a flexible stamp according to the invention with reservoirs in the imprinting pattern.

Figure 5E:
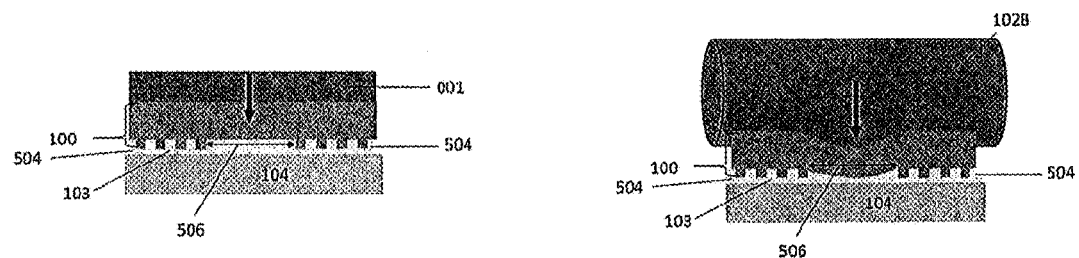

FIG. 5d and FIG. 5e schematically draft differences in the process between plate-to-plate imprinting and roll-to-plate imprinting. The picture on the right shows a roll-to-plate imprinting process. The picture on the left shows a plate-to-plate imprinting process.

Figure 6:
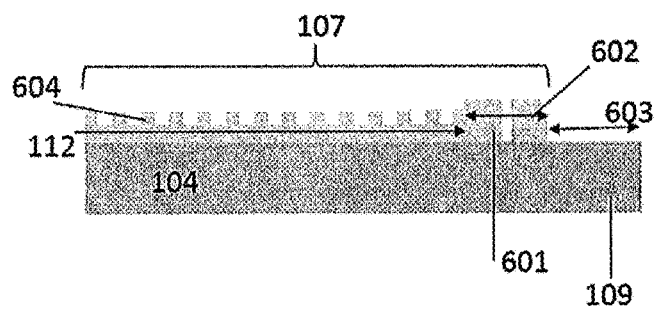

FIG. 6 schematically depicts a substrate according to the invention with is partially covered by a solidified layer and having a textured surface with inversed pattern of the reservoirs.

Figure 7:
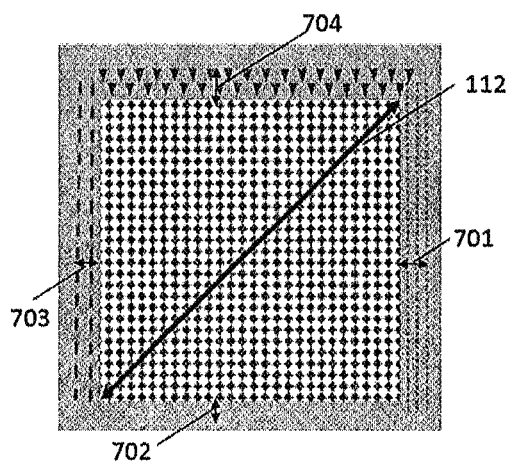

FIG. 7 schematically depicts a flexible stamp according to the invention.

Figure 8:
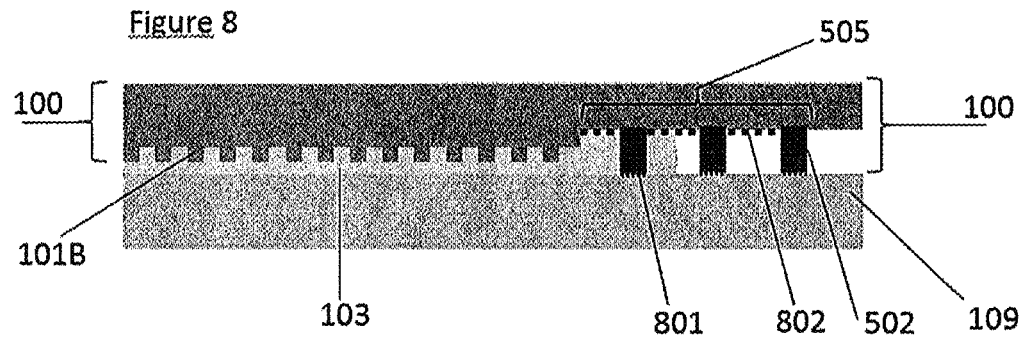

FIG. 8 schematically depicts a flexible stamp according to the invention with reservoirs having a different optical appearance.

The terms "imprint texture" and "imprint pattern" are used throughout the invention synonymously Referring now to FIG. 1 a schematic roll-to-plate imprint process is illustrated. In this case the functional imprint layer will be applied on top of a substrate 104. The substrate 104 can be any material; preferably the substrate 104 comprises or is made of glass, metal sheets, polycarbonate, PEN, PET, or PMMA. The substrate 104 may carry one or more additional layer(s) coated on top of the surface as for instance an adhesion promotion layer and/or an a transparent conductor layer (e.g. indiumtinoxide, aluminum doped zincoxide or fluor doped tinoxide). The desired functional imprint layer can be added on top of substrate 104 by use of an imprinting process. In this replication process the substrate 104 or a textured mold or both the substrate 104 and the mold are coated with a formable imprinting lacquer 103. In the example shown in FIG. 1 the substrate 104 is coated. The substrate 104 is placed on platform 110 for guidance and counter pressure. This platform 110 can be a roller, fixed table, moving table or any other platform providing sufficient counter pressure. In FIG. 1 the mold is a flexible stamp 100. The flexible stamp 100 has a supporting flexible stamp base 101A and a patterned outer surface 101B also referred to as "the imprint texture" or "the imprint pattern". This imprint texture has openings and elevations, which for those skilled in the art is known as relief pattern. This relief patterned outer surface 101B is the negative (or inverse) texture of the desired texture on the substrate. The patterned outer surface 101B has typically a residual layer 101C which can be varied in thickness. The flexible stamp base 101A and the patterned outer surface can be made of one and the same material, as for instance—but not limited to—thin metal sheets or plastic sheets made by a milling or hot embossing process. The flexible stamp can also be made using two or more materials have a flexible sheet as base 101A, as for instance but not limited to PET foil, PC foil, PEN foil or thin metal sheets, and an adhered textured organic layer 101B, as for instance but not limited to an acrylate material, a sol-gel material, an epoxy or second textured plastic foil. Even more layers can be added to enhance robustness or functionality of the flexible stamp, as for instance an anti-stick layer. The Young's Modules of the flexible stamp base 101A is between 0.1 Giga Pascal (GPa) and 10 Giga Pascal (GPa). The flexible stamp 100 is guided over imprint rollers 102. Note that for simplicity two rollers are drawn, with the start imprint roller 102A and release roller 102B. One roller could be sufficient or more rollers can be added to guide the flexible stamp 100.

The rollers can be made of a rigid material as for instance but not limited to, stainless steel, but preferably the rollers are made of a more elastic material as for instance, but not limited to, polychloroprene, polyurethane or EPDM with a typical shore-A hardness between 15 and 60. The rotation of the rollers 102 indicates the imprint direction, shown by the arrows, and starting the imprint at the beginning of the substrate 108 and ending at the end of the substrate 109. An imprinting lacquer 103 is supplied to the surface of the substrate 104. To transfer the functional textured texture the flexible stamp 100 with its outer surface, the imprint texture 101B, having the inverse texture of the desired functional texture is pressed on the substrate 104 with the imprinting lacquer 103 in between. Subsequently the formable imprinting lacquer 103 is (partial) cured either thermally or by use of UV light 106 to result the solidified layer 107. In FIG. 1 the formable lacquer is solidified by use of the UV light 106 from the UV light source 105. The UV light source 105 can be placed above a transparent flexible stamp 100. Or in case the substrate 104 is transparent, the UV light source 105 can be placed opposite to the flexible stamp 100 underneath the flexible substrate 104. In FIG. 1 the position of the UV light source 105 is in between the rollers 102. The position and angle of the UV light source 105 in respect to the rollers 102 can be altered to change the delay time between imprinting and curing. The UV light source 105 can also be placed in one of the two rollers 102, or opposite to the rollers 102. After solidification of the imprinting lacquer 103, the flexible stamp is separated from the solidified layer 107 on substrate 104 such that the substrate with solidified layer 107 is spaced apart from the mold in the inverse form of the outer surface pattern 101B.

After release of the flexible stamp 100 with imprint texture 101B, the substrate 104 with solidified layer 107 will have a textured surface. For most applications only a part of the substrate should have a textured surface. A reason could be to add contacts on a conductive layer underneath or to add a seal. As an example illustrated in FIG. 1b the substrate edges 111 of the substrate 104 remain free of imprinting lacquer and imprint texture. The solidified layer 107 covers a specified area 112 in the middle of substrate 104. This desired textured surface area 112 is referred to as the functional area in this invention.

In the roll-to-plate replication process the flexible stamp 100 is pressed into the formable imprinting lacquer 103. Due to this pressure the formable imprinting lacquer 103 will be formed into the desired texture shape after curing. If the fill ratio of the imprint texture 101B is known and constant, the thickness of imprinting lacquer 103 can have the exact same volume as the volume of the openings and elevations of the imprint texture (pattern) 101B. However due to defects, imperfection of the stamp 100, height differences of the substrate 104 as well as to avoid any air inclusion between of the imprinting lacquer 103 and the (flexible) stamp 100, the volume of imprinting lacquer 103 will have preferably a small surplus compared to the volume of the openings of imprint texture 101B.

As shown in FIG. 2, this surplus 201 of imprinting lacquer 103 will accumulate in front of the first roller 102A. The amount of surplus 201 will increase during the imprint process, unless decreased due to e.g. defects, irregularities or height variation.

Due to the pressure applied on the flexible stamp 100 with imprint texture 101B, the surplus of imprinting lacquer 201 will flow or will be pressed, directed or pushed to the edges and outer end of the substrate 109 as illustrated in FIG. 3. In this FIG. 3 the surplus 201 will be gathered at the end of the substrate 109. The flow distribution may be different for the different edges of the substrate 104; nevertheless largest surpluses will typically go to the end (the side of the substrate that will be imprinted last).

As further shown in FIG. 4, after solidification of the imprinting lacquer to become the solidified (imprinted) layer 107 by the UV light 106 and the separation of the flexible stamp 100 from the end of the substrate 109, part of the surplus 401 can remain at the edge of the substrate 109 and another part 402 can remain on the flexible stamp 100 on top of the imprint texture 101B. Both cases are unwanted, either for a less attractive visual appearance of the substrate or because of the build-up of cured lacquer on the stamp and the resulting in a limited re-use of the flexible stamp 100. Note that FIG. 3 illustrates the overflow at the end of the substrate. Some overflow will also occur at the sides. Moreover, for a partial coated surface and limited surplus of imprinting lacquer the overflow will not flow over the sides of the substrate as shown in FIG. 3 and FIG. 4, but the overflow will remain on top of the substrate. Since this flow of surplus of lacquer is irregular, it will result in irregular edges on the substrate after curing and release of the stamp.

To prevent substrate edge contamination and/or contamination of the flexible stamp 100, the surplus can be accumulated in reservoirs on the edges of the functional area. The reservoirs will not block the flow. The volume and shape of these reservoirs will determine the pathlength of the imprinting lacquer surplus flow at the edges of the functional area.

FIG. 5a illustrates the improvements of a flexible stamp 100 for roll-to-plate imprinting by altering the imprint texture 101B at the sides and replacing a part of them by a reservoir texture 505. This reservoir texture 505 is created by altering the texture on the flexible stamp. The reservoirs texture 505 is determined by reservoir openings 501 and/or reservoir elevations 502. These openings and elevations of the reservoir texture are different compared to the relief pattern of the functional area in such a way that underneath of the reservoir texture a domain of greater volume is achieved. The domain of greater volume will result in a reduced overflow area. Due to a limited overflow area the functional area can be increased or placed closer to the edge of the substrate. Typically within the domain of greater volume the volume of the relief texture, determined by the openings and elevations, will be—but not limited to— between a factor of 1.5 to 20 times larger compared to the volume of the functional area. This means that preferably the imprint texture comprises domains of 1.5 to 20 times greater volumes at the edges. Locally the volume within the domain of greater volume can differ for decorative or informative use.

The volume of the reservoir texture 505 can be increased, by increasing the residual layer thickness 101C of the imprint texture 101B of the flex stamp 100. In this case the reservoir opening 501 next to the functional texture is increased. This can be accomplished by increasing the residual layer thickness 101C of the imprint texture 101B on the flexible stamp base 101A as shown in FIG. 5b or by using an alternative material 508 as base for the imprint texture material in between the flexible stamp base 101A and imprint texture 101B as shown in FIG. 5c. If for example a thicker residual layer 101C of the texture material cannot be used in combination with the thickness uniformity or flexibility requirements of a flex stamp (i.e. due to cracking or delamination), the thicker base can be created by a filler material 508 that is compatible with such requirements. Such an alternative material 508 can act as filler that creates a uniform and flexible base for the imprint texture material. Also other properties like (partial or patterned) opaqueness can be added to such an alternative base material. Because the imprint texture 101B will be applied on such a base, it can also surround the base including the edges, which then can be rounded. The edges can then also be formed to any specific shape like a defined step, angle or (double) curvature. Example of a filler is a polycarbonate foil, but can be any other flexible foil, with required thickness.

This increase in residual layer thickness 101C is different from increasing the mold thickness or mesa height as mentioned in U.S. Pat. No. 8,361,371, which limits the contamination at the side of the mold as well as contamination of the mold holder. The proposed increase of residual layer thickness 101C within the mold, discussed in this patent application, will gather the lacquer underneath of the mold resulting in well-defined edges on an end product.

The volume of the reservoir texture 505 can also be increased by increasing the height of the reservoir elevations 502 and by optimizing the fill ratio of the elevations 502 which includes the density and the volume of the reservoir elevations 502. The number of the reservoir elevations 502 can be zero. In FIG. 5a the reservoirs are shown at the end of the substrate 109. However the reservoir texture 505 can be added on all sides of the flexible stamp, to control the overflow of surplus of imprinting lacquer to all sides or in the case of open or multiple functional areas on a substrate also on the inner side of functional areas. Due to the reservoirs the volume of the surplus 504 of the imprinting lacquer 103 will be gathered in the reservoir texture 505 and the pathlength of the flow of surplus of imprinting lacquer 103 to the different sides of the stamp 100 is reduced. Note that in FIG. 5a the reservoir elevations are drawn straight, but can be curved or any other shape as well.

FIG. 5d schematically shows in the picture on the right a known roll-to-plate imprinting process, wherein a roller 102B and a flexible mold 100 are pressed against substrate 104 with lacquer 103 between flexible mold 100 and substrate 104. Because in the known roll-to-plate process there is no texture at the edge of the flexible mold 100, the flexible mold 100 bends so that no reservoir gap is present to gather a surplus of imprint lacquer 504.

In contrast, in the known plate-to-plate imprinting process shown in the picture on the left of FIG. 5d a gap to gather surplus lacquer 504 remains, if a plate 001 presses mold 100 against substrate 104 with lacquer 103 between mold 100 and substrate 104. In the case of inner areas without texture 506, as for instance using a gutter, as shown in FIG. 5e, the lacquer will flow and remain underneath of this non-textured area in the case of a plate-to-plate process (left side), where in the case of the roll-to-plate imprint process this flat area will result in an additional outflow of lacquer 504 on the sides. The amount of outflow will increase in the case that the flexible mold is used in combination with a more elastic roller. Reservoir textures will be needed to prevent the flexible stamp from bending.

Referring now to FIG. 6 it can be seen that after curing of the imprinting lacquer to become the solidified layer 107 and release of the substrate 104, the functional imprint textures 604 as well as the inverse pattern 601 of the reservoir texture 505 are transferred to the substrate 104. The functional area 112 as shown in FIG. 1b will be imprinted as desired. Note that the functional area 112 can also have inner openings in the middle of the substrate, which will require a similar reservoir texture at the inner sides. The outer patterned reservoir area 602 will have a distinct area. The area 603 without solidified imprinting lacquer will be reduced in size, compared to the edge area 111 as shown in FIG. 1b. In the case the reservoirs are optically transparent, area 602 and 603 will be similar visually, and have the same size as edge area 111 as discussed in FIG. 1b.

An example of a flexible stamp according to the invention is illustrated in FIG. 7. As exemplified in FIG. 7, the reservoir elevations 502 can be shaped by blocks, cones or round pillars 701, triangular pillars 704, bars 703, flat 702 or any other shape. The presence of said blocks, cones or round pillars 701, triangular pillars 704, bars 703, flat shape 702 or any other shapes which are suitable to maintain a constant height between substrate 104 and supporting flexural stamp base 101A prevents that the flexible mold 100 bends, if it is pressed by roll 102B onto substrate 104 with lacquer 103 between the flexible mold 100 and substrate 104. Consequently, a reservoir gap is present to gather a surplus of imprint lacquer 504. The width of the elevations is typically in the micron to centimeter range. To gather the imprinting lacquer, the distance between the reservoir elevations will be in the micron to centimeter range. The height of the reservoir elevations 502 will be in the micron to millimeter range. The optimized distance of the reservoir elevations and or reservoir elevation height will depend on the hardness of the roller, the pressure applied, as well as the stiffness of the flexible stamp. As an example the distance between the functional and side reservoir 506 in FIG. 5e, elevation texture should not exceed 3 mm in the case of a 250 micron thick polycarbonate flexible stamp with a functional texture and same additional reservoir texture with 25 micron elevation height, an applied pressure of 1N/cm and a roller hardness shore 30.

The reservoir elevations can be positioned in a periodic refractive texture.

The reservoir texture can have same texture as the functional area. It is also proposed that the reservoir area 602, as illustrated in FIG. 6, with elevations and area in between the elevations will have a clear different optical appearance compared to the functional area 112. Due to this difference in appearance a distinct edge of the functional texture will appear, which will be visual more appealing. This distinct edge can be a defined straight line, have a defined curvature or can be a combination of both. To alter the appearance of the outer patterned reservoir area 602 in FIG. 6 a combination of textures can be used. FIG. 8 illustrates a possible reservoir texture 505 of flexible stamp 100. To change the appearance either the surface of the reservoir openings 801 or the surface of the reservoir elevations 802 can be altered. Both surfaces can be separately chosen to be—but not limited to—transparent, diffractive, diffusive or refractive.

The final appearance of the reservoir area can be a combination of the textured surfaces 801 and 802 in combination with the density of the reservoir elevations 502. In each case the density of the reservoir elevations 502 can be zero, resulting in a flat reservoir area 702, as shown in FIG. 7, or close to 100% including a possible gradient in density or a certain distribution. Note that the reservoir texture, possibly including the additional surface texture on the reservoir openings 801 and reservoir elevations 802, can be positioned in a decorative or informative manner. For instance by combining different reservoir shapes e.g. text, barcodes, logo's, pictures or any defined pattern can be visualized.

The volume which can be accumulated in the reservoirs can be calculated. Assume for example a texture shape of 40 µm high and a 50% fill factor. If a 2% surplus of imprinting lacquer 103 is pushed forward by use of a textured flex stamp to one outer edge of a 1×1 m² functional area 112, and no reservoir elevations are applied, an overflow area of 1000 mm×20 mm of imprinting lacquer will be present. This overflow area 602 in FIG. 6 will be reduced to 2 mm, if a reservoir is added with a 15% spacer fill factor and a 200 µm residual layer thickness 101C as shown in FIG. 5a.

In principle, reservoir elevations can be placed on the substrate, instead of on the flex stamp as well.

A further part of the present invention is a stamp for roll-to-plate texturing or patterning discrete substrates comprising an imprint texture as its outer surface layer which imprint texture is formed by openings and elevations thus creating volumes in the imprint texture, characterized in that the imprint texture comprises domains of greater volumes at the edges to form a reservoir area, and in that the stamp is a flexible stamp with a Young's Modulus of between 0.1 Giga Pascal (GPa) and 10 Giga Pascal (GPa), preferably between 0.5 Giga Pascal (GPa) and 5 Giga Pascal (GPa).

The invention claimed is:

1. A roll-to-plate process for texturing or patterning discrete substrates, the substrate including displays, lighting, or solar panels, comprising the steps of:
   supplying an imprinting lacquer; and
   texturing or patterning the imprinting lacquer with a flexible stamp having an imprint texture defining a relief texture volume and a reservoir texture defining reservoir texture volume adjacent the imprint texture, which reservoir texture is open towards the edges of the flexible stamp, the flexible stamp has a Young's Modulus of between 0.1 Giga Pascal (GPa) and 10 GPa, and the reservoir texture volume is 1.5 to 20 times greater than the relief texture volume,
   whereby as a roller presses the imprint lacquer onto the substrate, excess imprint lacquer is guided into the reservoir texture and contamination of the substrate and flexible stamp is prevented.

2. The process of claim 1 wherein the reservoir texture volume is created by increasing the depth of the openings and/or the height of the elevations in the reservoir texture.

3. The process of claim 1 wherein the reservoir texture is located on an outer surface of the stamp.

4. The process of claim 1 further comprising curing the imprinted lacquer to obtain a solidified textured or patterned layer.

5. The process of claim 4 wherein the curing is performed thermally and/or by applying UV light.

* * * * *